(12) United States Patent
Goda

(10) Patent No.: US 12,062,396 B2
(45) Date of Patent: *Aug. 13, 2024

(54) MEMORY DEVICES HAVING SOURCE LINES DIRECTLY COUPLED TO BODY REGIONS AND METHODS

(71) Applicant: Lodestar Licensing Group, LLC, Evanston, IL (US)

(72) Inventor: Akira Goda, Setagaya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/205,679

(22) Filed: Jun. 5, 2023

(65) Prior Publication Data
US 2023/0317172 A1 Oct. 5, 2023

Related U.S. Application Data

(60) Continuation of application No. 17/726,059, filed on Apr. 21, 2022, now Pat. No. 11,705,205, which is a continuation of application No. 17/084,244, filed on Oct. 29, 2020, now Pat. No. 11,361,827, which is a continuation of application No. 15/985,973, filed on May 22, 2018, now Pat. No. 10,825,528, which is a continuation of application No. 15/339,374, filed on Oct. 31, 2016, now Pat. No. 9,997,247, which is a division of application No. 14/299,813, filed on Jun. 9, 2014, now Pat. No. 9,484,100, which is a division
(Continued)

(51) Int. Cl.
| | | |
|---|---|---|
| G11C 16/14 | (2006.01) | |
| G11C 16/04 | (2006.01) | |
| G11C 16/10 | (2006.01) | |
| H10B 41/27 | (2023.01) | |
| H10B 41/35 | (2023.01) | |

(52) U.S. Cl.
CPC .......... *G11C 16/14* (2013.01); *G11C 16/0483* (2013.01); *G11C 16/10* (2013.01); *H10B 41/27* (2023.02); *H10B 41/35* (2023.02)

(58) Field of Classification Search
CPC .... H10B 41/35; H10B 41/27; G11C 16/0483; G11C 16/10; G11C 16/14
See application file for complete search history.

(56) References Cited

U.S. PATENT DOCUMENTS

| | | |
|---|---|---|
| 4,168,444 A | 9/1979 | Van |
| 4,827,448 A | 5/1989 | Kuo |
| 5,721,871 A | 2/1998 | Ginsberg et al. |

(Continued)

FOREIGN PATENT DOCUMENTS

| | | |
|---|---|---|
| CN | 101055875 A | 10/2007 |
| CN | 101461011 A | 6/2009 |

(Continued)

OTHER PUBLICATIONS

"Chinese Application Serial No. 201280006100.4, Amendment filed May 9, 2014", w/English Claims, 10 pgs.
(Continued)

*Primary Examiner* — Hien N Nguyen
(74) *Attorney, Agent, or Firm* — Fletcher Yoder, P.C.

(57) ABSTRACT

Memory devices, memory cell strings and methods of operating memory devices are shown. Configurations described include directly coupling an elongated body region to a source line. Configurations and methods shown should provide a reliable bias to a body region for memory operations such as erasing.

20 Claims, 5 Drawing Sheets

Related U.S. Application Data of application No. 13/011,223, filed on Jan. 21, 2011, now Pat. No. 8,750,040.

(56) References Cited

U.S. PATENT DOCUMENTS

| | | | |
|---|---|---|---|
| 5,802,555 | A | 9/1998 | Shigeeda |
| 6,118,159 | A | 9/2000 | Willer et al. |
| 6,718,432 | B1 | 4/2004 | Srinivasan |
| 6,744,094 | B2 | 6/2004 | Forbes |
| 7,369,438 | B2 | 5/2008 | Lee et al. |
| 7,403,417 | B2 | 7/2008 | Cohen |
| 8,174,893 | B2 * | 5/2012 | Goda ............... G11C 16/0483 365/185.27 |
| 8,274,108 | B2 | 9/2012 | Katsumata et al. |
| 8,750,040 | B2 | 6/2014 | Goda |
| 9,484,100 | B2 | 11/2016 | Goda et al. |
| 9,997,247 | B2 | 6/2018 | Goda |
| 10,825,528 | B2 | 11/2020 | Goda |
| 11,361,827 | B2 | 6/2022 | Goda |
| 2003/0081449 | A1 | 5/2003 | Beucler |
| 2004/0130942 | A1 | 7/2004 | Yeh et al. |
| 2004/0202028 | A1 | 10/2004 | Cioaca |
| 2005/0201182 | A1 * | 9/2005 | Osada ............... G11C 7/04 365/230.03 |
| 2006/0054976 | A1 | 3/2006 | Verhoeven |
| 2006/0237706 | A1 | 10/2006 | Enda et al. |
| 2007/0158736 | A1 | 7/2007 | Arai et al. |
| 2007/0296015 | A1 | 12/2007 | Aritome |
| 2008/0002475 | A1 | 1/2008 | Yang et al. |
| 2008/0239847 | A1 | 10/2008 | Jung et al. |
| 2008/0248622 | A1 * | 10/2008 | Matamis ............... H10B 41/48 257/E21.409 |
| 2009/0022001 | A1 | 1/2009 | Morishita et al. |
| 2009/0162951 | A1 * | 6/2009 | Orimoto ............... H10B 41/30 257/E21.528 |
| 2009/0189211 | A1 * | 7/2009 | Orimoto ............... H10B 41/10 257/E21.179 |
| 2009/0207642 | A1 | 8/2009 | Shimano et al. |
| 2010/0034028 | A1 | 2/2010 | Katsumata et al. |
| 2010/0110789 | A1 | 5/2010 | Chandrasekhar |
| 2010/0177566 | A1 | 7/2010 | Kim et al. |
| 2010/0207190 | A1 | 8/2010 | Katsumata et al. |
| 2010/0207194 | A1 | 8/2010 | Tanaka et al. |
| 2010/0213527 | A1 * | 8/2010 | Shim ............... H01L 27/0207 257/E27.06 |
| 2010/0214838 | A1 | 8/2010 | Hishida et al. |
| 2010/0232224 | A1 | 9/2010 | Maeda et al. |
| 2010/0240182 | A1 * | 9/2010 | Kai ............... H10B 41/35 257/E21.409 |
| 2010/0244119 | A1 | 9/2010 | Fukuzumi et al. |
| 2010/0254194 | A1 | 10/2010 | Chou et al. |
| 2011/0103153 | A1 | 5/2011 | Katsumata et al. |
| 2012/0134215 | A1 | 5/2012 | Goda |
| 2012/0188825 | A1 | 7/2012 | Goda |
| 2012/0199877 | A1 | 8/2012 | Liu et al. |
| 2012/0262987 | A1 | 10/2012 | Kuo et al. |
| 2013/0043505 | A1 | 2/2013 | Tessariol et al. |
| 2013/0178025 | A1 | 7/2013 | Haller et al. |
| 2013/0194867 | A1 | 8/2013 | Fukuda et al. |
| 2014/0286106 | A1 | 9/2014 | Goda |
| 2014/0313833 | A1 | 10/2014 | Liu et al. |
| 2015/0255619 | A1 | 9/2015 | Shimabukuro |
| 2016/0049192 | A1 | 2/2016 | Lee |
| 2016/0233224 | A1 | 8/2016 | Rhie |
| 2017/0047120 | A1 | 2/2017 | Goda |
| 2018/0268909 | A1 | 9/2018 | Goda |
| 2021/0043259 | A1 | 2/2021 | Goda |
| 2022/0246215 | A1 | 8/2022 | Goda |

FOREIGN PATENT DOCUMENTS

| | | |
|---|---|---|
| CN | 101515478 A | 8/2009 |
| CN | 101764096 A | 6/2010 |
| CN | 103329270 A | 9/2013 |
| CN | ZL201280006100.4 | 4/2018 |
| CN | 108694978 A | 10/2018 |
| CN | 108694978 B | 5/2022 |
| JP | 2005260014 A | 9/2005 |
| JP | 2010166055 A | 7/2010 |
| JP | 2010199235 A | 9/2010 |
| JP | 2010212518 A | 9/2010 |
| JP | 2010225946 A | 10/2010 |
| JP | 4897009 B2 | 3/2012 |
| KR | 1020090017587 A | 2/2009 |
| KR | 20090029248 A | 3/2009 |
| TW | 201237874 A | 9/2012 |
| TW | I525623 B | 3/2016 |
| WO | WO-2012100056 A2 | 7/2012 |

OTHER PUBLICATIONS

"Chinese Application Serial No. 201280006100.4, Office Action mailed Jan. 5, 2016", W/ English Translation, 7 pgs.

"Chinese Application Serial No. 201280006100.4, Office Action mailed Feb. 4, 2017", W/English Translation, 7 pgs.

"Chinese Application Serial No. 201280006100.4, Office Action mailed Jul. 4, 2017", w/English Translation, 8 pgs.

"Chinese Application Serial No. 201280006100.4, Office Action mailed Sep. 28, 2017", With English Translation, 5 pgs.

"Chinese Application Serial No. 201280006100.4, Office Action mailed Oct. 13, 2014", W/ English Translation, 10 pgs.

"Chinese Application Serial No. 201280006100.4, Response filed Apr. 14, 2016 to Office Action mailed Jan. 5, 2016", W/ English Claims, 13 pgs.

"Chinese Application Serial No. 201280006100.4, Response Filed Apr. 18, 2017 to Office Action mailed Feb. 4, 2017", (W/ English Claims), 9 pgs.

"Chinese Application Serial No. 201280006100.4, Response filed Jul. 13, 2017 to Office Action mailed Jul. 4, 2017", w/English Claims, 8 pgs.

"Chinese Application Serial No. 201280006100.4, Response filed Jul. 30, 2014 to Office Action mailed Oct. 13, 2014", W/ English Claims, 4 pgs.

"Chinese Application Serial No. 201280006100.4, Response filed Nov. 29, 2017 to Office Action mailed Sep. 28, 2017", w/ Amended Claims, 12 pgs.

"Chinese Application Serial No. 201810252573.1, Office Action mailed Jul. 30, 2021", w/ English translation, 12 pgs.

"Chinese Application Serial No. 201810252573.1, Response filed Dec. 14, 2021 to Office Action mailed Jul. 30, 2021", 23 pgs.

"Chinese Application Serial No. 201810252573.1, Voluntary Amendment Filed Jan. 17, 2019", w/ English Claims, 19 pgs.

"International Application Serial No. PCT/US2012/021873, International Preliminary Report on Patentability mailed Aug. 1, 2013", 6 pgs.

"International Application Serial No. PCT/US2012/021873, International Search Report mailed Jul. 30, 2012", 3 pgs.

"International Application Serial No. PCT/US2012/021873, Written Opinion mailed Jul. 30, 2012", 4 pgs.

"Japanese Application Serial No. 2013-550579, Office Action mailed Jun. 2, 2015", W/ English Translation, 15 pgs.

"Japanese Application Serial No. 2013-550579, Office Action mailed Dec. 8, 2015", W/ Machine Translation, 6 pgs.

"Japanese Application Serial No. 2013-550579, Response filed Mar. 3, 2016 to Office Action mailed Dec. 8, 2015", W/ English Claims, 5 pgs.

"Japanese Application Serial No. 2013-550579, Response filed Aug. 31, 2015 to Office Action mailed Jun. 2, 2015", W/ Machine Translation, 11 pgs.

* cited by examiner

MEMORY DEVICES HAVING SOURCE LINES DIRECTLY COUPLED TO BODY REGIONS AND METHODS

PRIORITY APPLICATION

This application is a continuation of U.S. application Ser. No. 17/726,059, filed Apr. 21, 2022, which is a continuation of U.S. application Ser. No. 17/084,244, filed Oct. 29, 2020, now issued as U.S. Pat. No. 11,361,827, which is a continuation of U.S. application Ser. No. 15/985,973, filed May 22, 2018, now issued as U.S. Pat. No. 10,825,528, which is a continuation of U.S. application Ser. No. 15/339,374, filed Oct. 31, 2016, now issued as U.S. Pat. No. 9,997,247, which is a divisional of U.S. application Ser. No. 14/299,813, filed Jun. 9, 2014, now issued as U.S. Pat. No. 9,484,100, which is a divisional of U.S. application Ser. No. 13/011,223, filed Jan. 21, 2011, now issued as U.S. Pat. No. 8,750,040, all of which are incorporated herein by reference in their entirety.

BACKGROUND

Higher memory density is always in demand to provide smaller devices with higher memory capacity. Forming memory devices laterally on a surface of a semiconductor chip uses a great deal of chip real estate. Improved memory devices are needed with new configurations to further increase memory density beyond traditional laterally formed memory devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
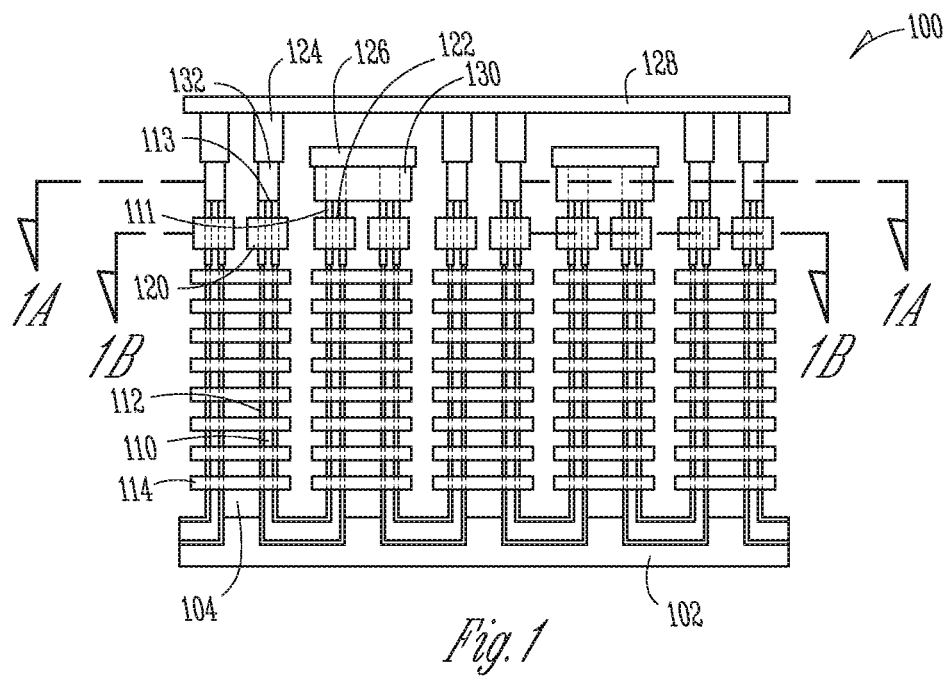
FIG. 1 shows a memory device according to an embodiment of the invention.
Figure 1A:
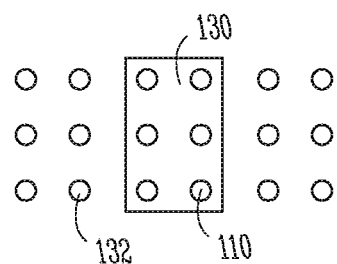
FIG. 1A shows a cross section along line 1A-1A from FIG. 1 according to an embodiment of the invention.
Figure 1B:
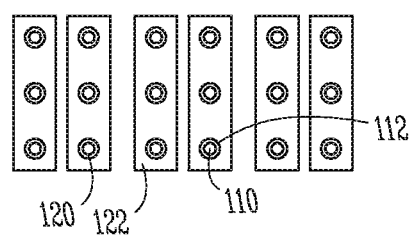
FIG. 1B shows a cross section along line 1B-1B from FIG. 1 according to an embodiment of the invention.

FIGS. 1, 1A, and 1B show a memory device 100 formed on a substrate 102. A charge storage layer(s) 112 (e.g., a combination of a tunnel dielectric layer, a polysilicon layer, and a charge blocking layer; a combination of a nitride layer, an oxide layer, and a nitride layer; or other any other layer or combination of layers that can provide a charge storage function, whether currently known or future developed), substantially surrounds an elongated body region 110 to form a respective charge structure corresponding to each of a plurality of gates 114 (which may also substantially surround respective cross sections of the elongated body region 110 and charge storage layer(s) 112). A first select gate 120 and a second select gate 122 are shown to selectively couple the elongated body region 110 to drain region 132 and a source region 130, respectively. A dielectric 104 can fill in spaces between components such as those described above.

FIG. 1A shows an embodiment where the elongated body region 110 forms a "U" shape with a pair of upward facing ends 111, 113. Another example configuration (not shown) includes a linear, vertical, elongated body region 110 with one end facing upward, and the other end facing downward. Another example configuration (not shown) includes a horizontal, linear, elongated body region 110 with ends on either side. Embodiments with two upward facing ends, 111, 113, such as the "U" shaped configuration, can enable easier formation of some components at the ends 111, 113 of the elongated body region 110 during manufacture, compared to embodiments where components are formed deeper in the structure.

In one example, the elongated body region 110 is formed from a p type semiconductor material, such as p-type polysilicon. The elongated body region 110 can be formed in multiple process steps, such as where a first end 111 is formed in a different polysilicon deposition step than that used to form other portions of the elongated body region 110, such as second end 113. Accordingly, in at least some embodiments, first end 111 may be higher than second end 113. A source region 130 and a drain region 132 are shown coupled to the first end 111 and the second end 113 of the elongated body region 110, respectively. In one example, the source region 130 and the drain region include n type semiconductor material, such as n+ polysilicon. In operation, the pathway of source region 130, to elongated body region 110, to drain region 132 acts as an n-p-n transistor, with select gates 120, 122, and gates 114 operating to allow, or inhibit signal transmission along the way.

A source line 126 and a data line, such as bitline 128, are shown coupled to the source region 130 and the drain region 132 respectively. In one embodiment, a plug 124 is used to directly couple (e.g., directly physically connect to form an electrical connection, or otherwise form an electrical connection without a potential for a n-p or p-n junction breakdown) the bitline 128 to the drain region 132. Each of the source line 126, bitline 128 and plug 124 can comprise, consist of, or consist essentially of metal, such as aluminum, copper, or tungsten, or alloys of these or other conductor metals. In the present disclosure, the term "metal" further includes metal nitrides, or other materials that operate primarily as conductors.

As noted above, FIG. 1 shows the drain region 132 directly coupled to the plug 124, which effectively couples the drain region 132 to the bitline 128. The source region 130 is shown directly coupled to the source line 126. The elongated body region 110 is also directly coupled to the source line 126.

The cross section along line 1B-1B shows the select gates 120 and 122. As can be seen in the cross section, in one embodiment, the select gates 120 and 122 are substantially continuous along a row. In this configuration, actuation of a select gate 120 or 122 actuates a plurality of elongated body regions at a time.

The cross section shown along line 1A-1A shows a number of drain regions 132 and a source region 130. As can be seen in the cross section, in one embodiment, the drain regions 132 are separate, while the source region 130 is substantially continuous, with a single source region 130 used for a plurality of elongated body regions 110. In one example the source region 130 substantially surrounds a cross section of a first end 111 of each of a plurality of elongated body regions 110.

By directly coupling the elongated body region 110 to the source line 126, the elongated body region 110 has the ability to be biased, and operate less as a floating body element. Biasing of the elongated body region 110 via a direct coupling can provide reliable memory operations such as an erase operation in particular.

Figure 2A:
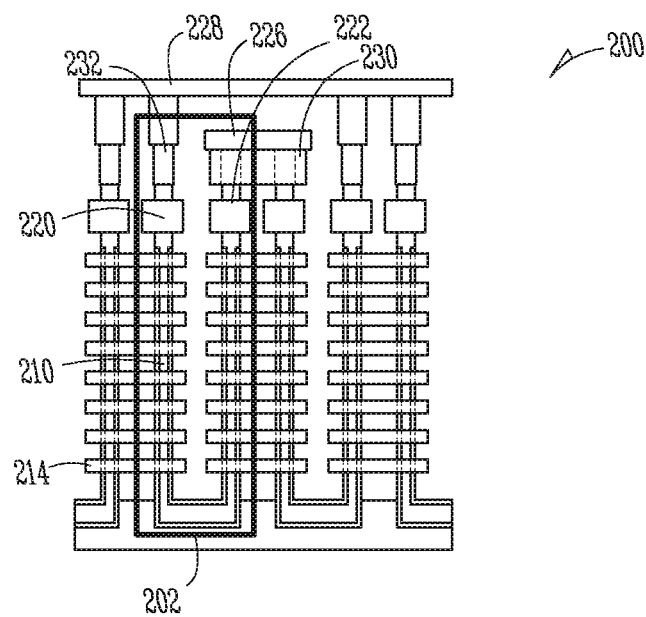
FIG. 2A shows a memory device during an erase operation according to an embodiment of the invention.
Figure 2B:
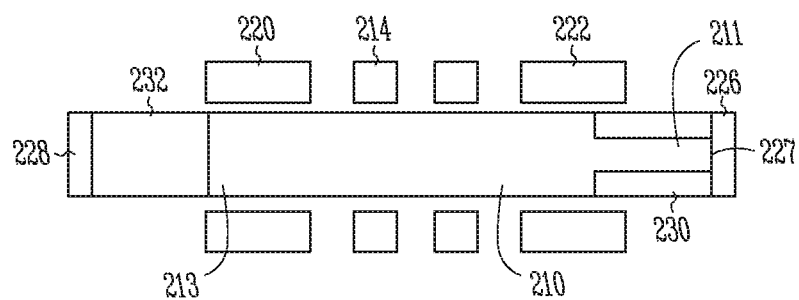
FIG. 2B shows a block diagram of a portion of the memory device from FIG. 2A during an erase operation according to an embodiment of the invention.

An example erase operation, according to an embodiment of the invention, is illustrated with respect to FIGS. 2A and 2B. A memory device 200, similar to embodiments described above, is shown with an example memory cell string 202 circled in the figures. According to one such erase operation embodiment, with the bitline 228 and select gates 220, 222 of string 202 floating, the source line 226, and thus the elongated body region 210 of the string 202, is biased to an erase voltage (e.g., approximately 20 volts), and the gates 214 of the string 202 are biased to a selected voltage (e.g., approximately 0 volts). Given the provided example biasing voltages, the select gates 220, 222 of string 202 are thus coupled up to approximately 15 volts, while the bit line 228 (and plug 124) is coupled up to approximately 20 volts. The potential difference between the body region 110 and gates 214 (e.g., 20 volts to zero volts) is used to erase stored charge from the charge storage structure adjacent to each individual gate 214 in the memory cell string 202.

Because the elongated body region 210 is directly coupled to the source line 226, the elongated body region 210 is biased when a bias is applied to the source line 226. Direct coupling between the elongated body region 210 and the source line 226 provides a charge pathway between the elongated body region 210 and the source line 226 that avoids junction breakdown between an n-type region and a p type region.

In FIG. 2B, the direct coupling of the elongated body region 210 to the source line 226 can be seen at a first end 211 of the elongated body region 210. In contrast, a second end 213 of the elongated body region 210 is indirectly coupled to the bitline 228 through the drain region 232.

Figure 3:
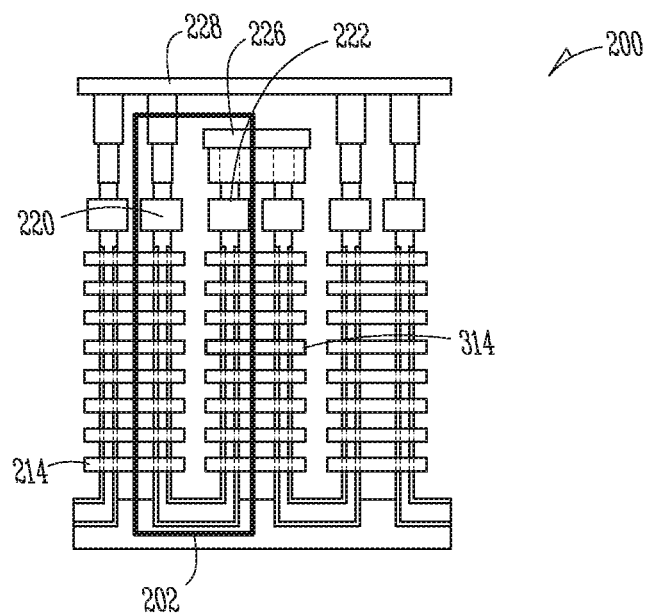
FIG. 3 shows a memory device during a program operation according to an embodiment of the invention.

FIG. 3 shows a memory device 200 undergoing an example program operation according to an embodiment of the invention. The memory device 200 from previous Figures is used as an example. As in FIG. 2A, an example memory cell string 202 is circled.

With FIG. 3 as a reference, the bitline 228, source line 226 and source select gate 222 are biased to respective program enable voltages (e.g., approximately zero volts each). A selected gate 314 is biased with a program voltage (e.g., approximately 20 volts), while the drain select gate 220 of the selected string 202 is biased to, e.g., approximately 2 volts. The potential difference between the selected gate 314 and the body region of the selected string 202 (e.g., 20 volts to zero volts) is used to transfer charge to the charge storage structure adjacent to the selected gate 314 in the selected memory cell string 202. To avoid programming a memory cell corresponding to selected gate 314 in the adjacent, unselected string, the drain select gate of that string can be biased to, for example, approximately zero volts. Unselected gates 214 are biased with an inhibit voltage (e.g., approximately 10 volts) to couple up the body region of the unselected string to an inhibit voltage.

Figure 4:
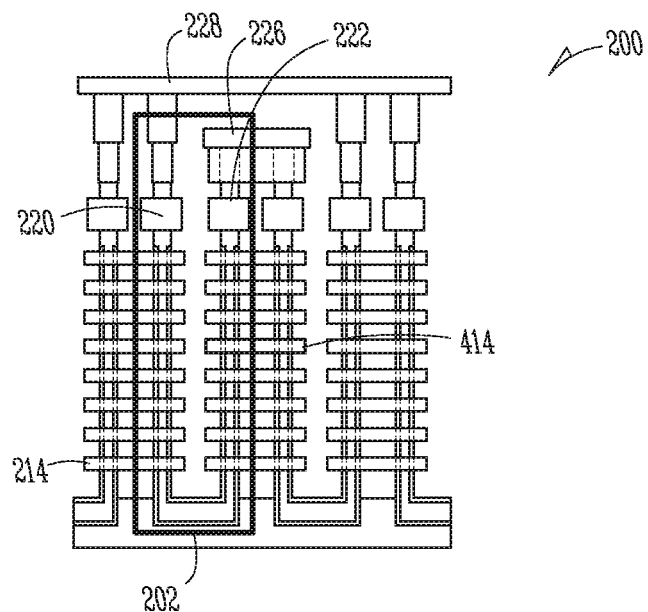
FIG. 4 shows a memory device during a read operation according to an embodiment of the invention.

FIG. 4 shows a memory device 200 undergoing an example read operation according to an embodiment of the invention. The memory device 200 from previous Figures is used as an example. As in previous Figures, an example memory cell string 202 circled.

With FIG. 4 as a reference, the bitline 228 is biased to, for example, approximately 0.5 volts, and the source line 226 is biased to, for example, approximately zero volts. A selected gate 314 is biased with a read voltage (e.g., between approximately 0 volts and approximately 4 volts, such as depending upon what program state is being read), while the drain select gate 220 of the selected string 202 is biased to, e.g., approximately 2 volts. Unselected gates 214 are biased to a pass voltage (e.g., approximately 6 volts) to permit a signal to pass along the elongated body region of the selected string. If gate 314 is erased, then the signal will pass through the elongated body region of the selected string and be detected. To avoid reading a memory cell corresponding to selected gate 314 in an adjacent, unselected string, the drain select gate of that string can be biased to, for example, approximately zero volts.

Figure 5:
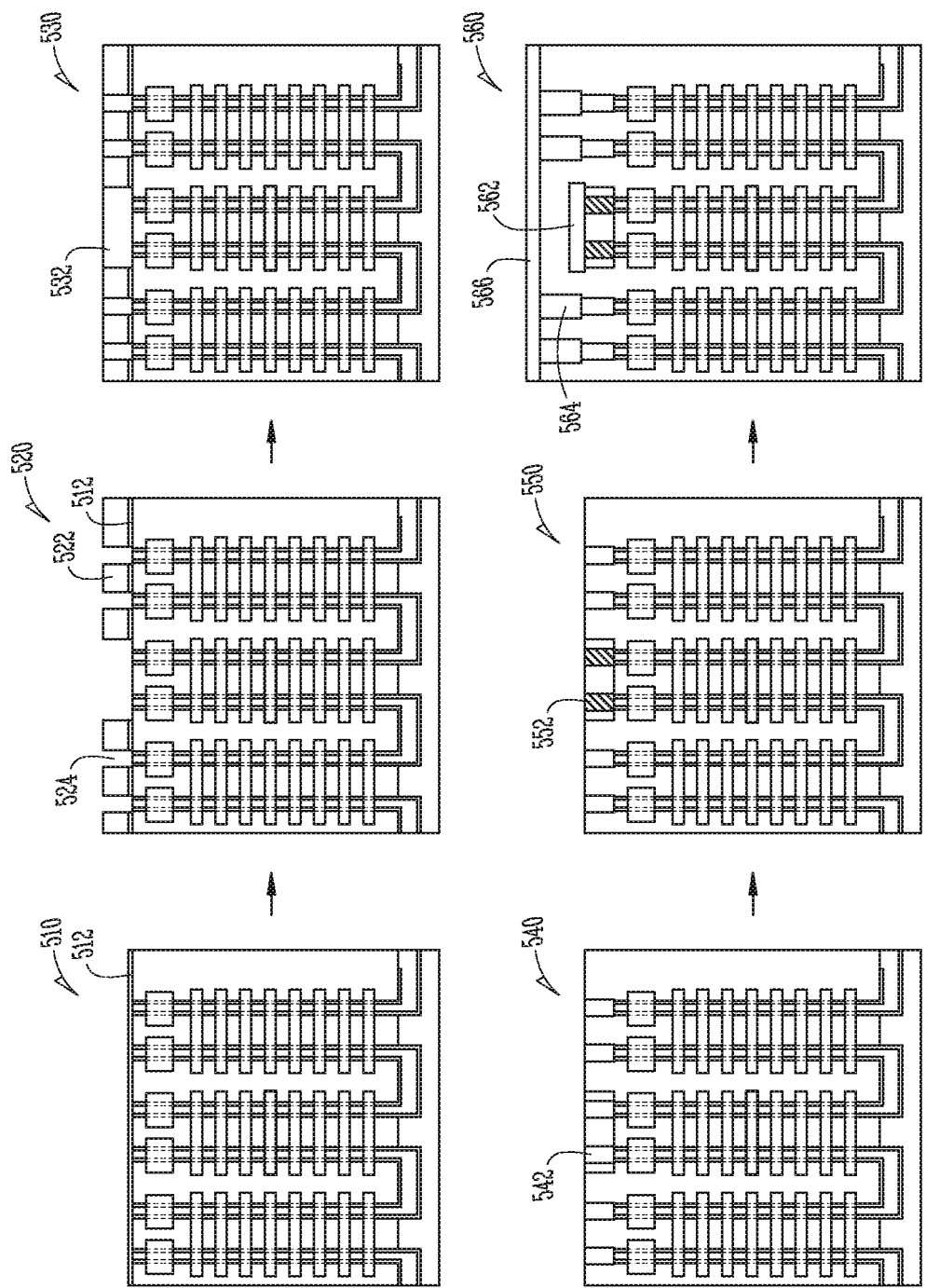
FIG. 5 shows selected stages of forming a memory device according to an embodiment of the invention.

FIG. 5 illustrates an example process flow to form selected portions of a memory device according to an embodiment of the invention. In particular, the example process flow of FIG. 5 illustrates one method of directly coupling an elongated body region to a sourceline. Operation 510 illustrates a planarization and etch stop operation. In one embodiment, an etch stop layer 512 is a silicon nitride (SiN) layer. Operation 520 illustrates a dielectric layer 522 deposition and patterning step. A number of openings 524 are shown formed in the dielectric layer 522 by etching or other suitable process. Operation 530 illustrates formation of source regions and drain regions by filling in the number of openings 524 with an n doped semiconductor. In one embodiment, the number of openings 524 are filled with an n+ polysilicon material Operation 540 illustrates formation of a second number of openings 542 within the filled portion that will become source regions. In operation 550, the second number of openings 542 are filled to form an extension of the elongated body regions. In one example, the second number of openings 542 are filled with the same material as the elongated body region. In one example, the second number of openings 542 are filled with p+ polysilicon. Operation 560 illustrates a routing layer formation. Sourcelines 562, plugs 564 and bitlines 566 may be formed as part of the routing layer formation.

Figure 6:
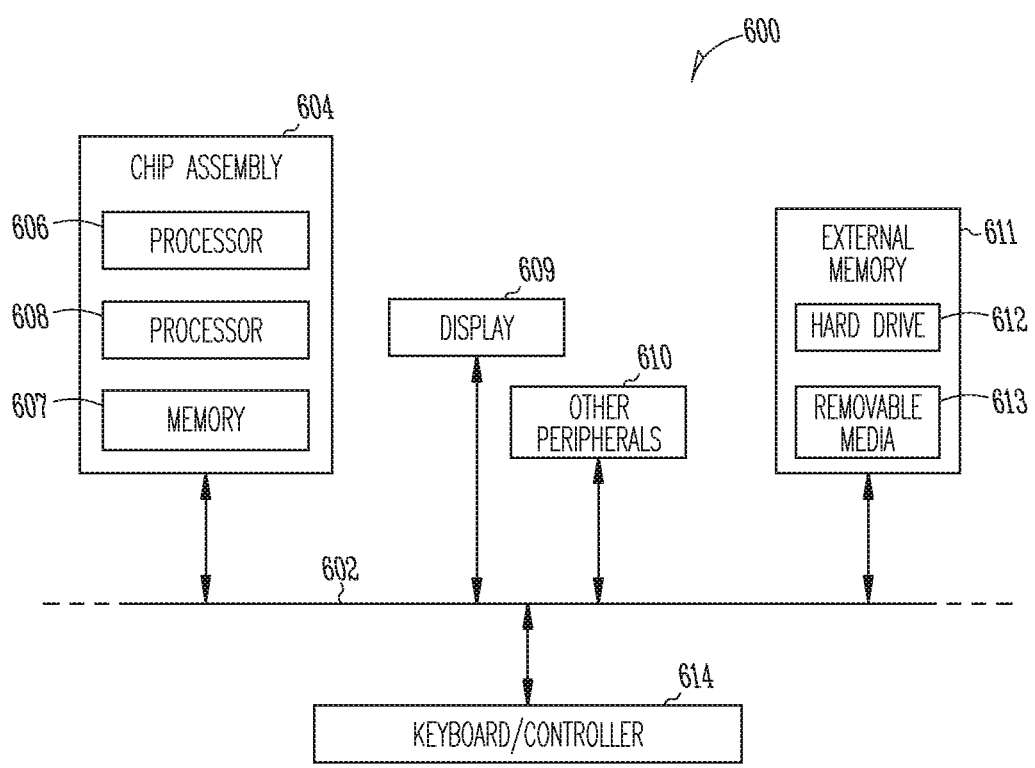
FIG. 6 shows an information handling system using a memory device according to an embodiment of the invention.

An embodiment of an information handling system such as a computer is included in FIG. 6 to show an embodiment of a high-level device application for the present invention.

FIG. 6 is a block diagram of an information handling system 600 incorporating a memory device according to embodiments of the invention as described above. Information handling system 600 is merely one embodiment of an electronic system in which decoupling systems of the present invention can be used. Other examples include, but are not limited to, tablet computers, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 607 is included in the chip assembly 604. In one embodiment, the memory device 607 includes a NAND memory device according to embodiments described above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A NAND memory string, comprising:
    an elongated polysilicon cylinder doped with a first conductivity type;
    a first end region doped with a second conductivity type, and coupled to a first end of the elongated polysilicon cylinder, and a second end region doped with the second conductivity type, and coupled to a second end of the elongated polysilicon cylinder;
    a plurality of gates along a length of the elongated polysilicon cylinder, each of the plurality of gates being separated from the elongated polysilicon cylinder by at least a charge storage structure; and
    a source line, wherein the first end of the elongated polysilicon cylinder is coupled to the source line by a portion of the elongated polysilicon cylinder that passes through the first end region.

2. The NAND memory string of claim 1, wherein the first conductivity type includes P-type and the second conductivity type includes N-type.

3. The NAND memory string of claim 1, wherein the first end region substantially surrounds a cross section of an end of the elongated polysilicon cylinder and is also coupled to the source line.

4. The NAND memory string of claim 1, wherein the elongated polysilicon cylinder is vertically formed above a substrate.

5. The NAND memory string of claim 1, wherein the elongated polysilicon cylinder forms a "U" shape.

6. The NAND memory string of claim 1, further including one or more select gates adjacent to the first or second end regions.

7. The NAND memory string of claim 1, wherein the source line includes a metal source line.

8. A NAND memory device, comprising:
    a plurality of strings of memory cells, where each string of memory cells is coupled at a first end to a data line and where each string of memory cells includes;
        an elongated polysilicon cylinder doped with a first conductivity type;
        a first end region doped with a second conductivity type, and coupled to a first end of the elongated polysilicon cylinder, and a second end region doped with the second conductivity type, and coupled to a second end of the elongated polysilicon cylinder;
        a plurality of gates along a length of the elongated polysilicon cylinder, each of the plurality of gates being separated from the elongated polysilicon cylinder by at least a charge storage structure; and
    a source line, wherein the first end of the elongated polysilicon cylinder is directly coupled to the source line by a portion of the elongated polysilicon cylinder that passes through the first end region; and
    a controller, wherein the controller is configured to concurrently float the data line, bias the source line to an erase potential, and perform an erase operation on the memory cells of the plurality of strings of memory cells.

9. The NAND memory device of claim 8, wherein the first conductivity type includes P-type and the second conductivity type includes N-type.

10. The NAND memory device of claim 8, wherein the elongated polysilicon cylinder is vertically formed above a substrate.

11. The NAND memory device of claim 8, wherein the controller is configured to bias the source line to approximately 20 volts for the erase operation.

12. The NAND memory device of claim 11, wherein the controller is configured to bias the plurality of gates to approximately zero volts for the erase operation.

13. An electronic system, comprising:
a communications interface;
a memory access device coupled to the communications interface and configured to generate memory device commands;
a memory device coupled to the communications interface and configured to be responsive to the memory device commands, the memory device including;
a plurality of strings of memory cells, where each string of memory cells is coupled at a first end to a data line and where each string of memory cells includes;
an elongated polysilicon cylinder doped with a first conductivity type;
a first end region doped with a second conductivity type, and coupled to a first end of the elongated polysilicon cylinder, and a second end region doped with the second conductivity type, and coupled to a second end of the elongated polysilicon cylinder;
a plurality of gates along a length of the elongated polysilicon cylinder, each of the plurality of gates being separated from the elongated polysilicon cylinder by at least a charge storage structure;
a source line, wherein the first end of the elongated polysilicon cylinder is directly coupled to the source line by a portion of the elongated polysilicon cylinder that passes through the first end region; and
a controller, wherein the controller is configured to concurrently float the data line, bias the source line to an erase potential, and perform an erase operation on the memory cells of the plurality of strings of memory cells.

14. The electronic system of claim 13, wherein the first conductivity type includes P-type and the second conductivity type includes N-type.

15. The electronic system of claim 13, wherein the elongated polysilicon cylinder is oriented horizontally.

16. The electronic system of claim 13, wherein the elongated polysilicon cylinder is oriented vertically.

17. The electronic system of claim 13, wherein the controller is configured to bias the source line to approximately 20 volts for the erase operation.

18. The electronic system of claim 17, wherein the controller is configured to bias the plurality of gates to approximately zero volts for the erase operation.

19. The electronic system of claim 13, further including a processor coupled to the memory device.

20. The electronic system of claim 19, further including a display coupled to the processor and the memory device.

* * * * *